US008592305B2

(12) United States Patent
Lu et al.

(10) Patent No.: US 8,592,305 B2
(45) Date of Patent: Nov. 26, 2013

(54) DOPING ALUMINUM IN TANTALUM SILICIDE

(75) Inventors: Xinliang Lu, Fremont, CA (US);
Seshadri Ganguli, Sunnyvale, CA (US);
Shih Chung Chen, Cupertino, CA (US);
Atif Noori, Saratoga, CA (US);
Maitreyee Mahajani, Saratoga, CA (US); Mei Chang, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 133 days.

(21) Appl. No.: 13/296,715

(22) Filed: Nov. 15, 2011

(65) Prior Publication Data

US 2013/0122697 A1 May 16, 2013

(51) Int. Cl.
*H01L 21/4763* (2006.01)

(52) U.S. Cl.
USPC .......... 438/649; 438/683; 257/E21.2

(58) Field of Classification Search
USPC .......... 438/582–583, 648–649, 682–683; 257/E21.2
See application file for complete search history.

(56) References Cited

U.S. PATENT DOCUMENTS

| 4,673,968 A | 6/1987 | Hieber et al. |
| 2005/0070062 A1 | 3/2005 | Visokay et al. |
| 2009/0008724 A1 | 1/2009 | Mishima et al. |
| 2011/0263115 A1 * | 10/2011 | Ganguli et al. ............... 438/595 |

OTHER PUBLICATIONS

International Search Report and Written Opinion of PCT/US2012/063809, mailed on Feb. 27, 2013, 12 pages.
Schwalke, Udo et al., "Hot Carrier Relief of Metal Oxide Semiconductor Field Effect Transistor by Using Work-Function Engineering", Japanese Journal of Applied Physics, vol. 29, No. 12 1990, pp. L 2286-L 2288.

* cited by examiner

*Primary Examiner* — Thanhha Pham
(74) *Attorney, Agent, or Firm* — Servilla Whitney LLC

(57) ABSTRACT

Provided are methods of providing aluminum-doped $TaSi_x$ films. Doping $TaSi_x$ films allows for the tuning of the work function value to make the $TaSi_x$ film better suited as an N-metal for NMOS applications. One such method relates to soaking a $TaSi_x$ film with an aluminum-containing compound. Another method relates to depositing a $TaSi_x$ film, soaking with an aluminum-containing compound, and repeating for a thicker film. A third method relates to depositing an aluminum-doped $TaSi_x$ film using tantalum, aluminum and silicon precursors.

14 Claims, No Drawings

DOPING ALUMINUM IN TANTALUM SILICIDE

FIELD

The present invention relates generally to a method of forming a metal gate in semiconductor devices. More particularly, the disclosed method relates to a method of depositing an N-Metal film, such as $TaSi_x$, onto a gate insulating substrate.

BACKGROUND

Integrated circuit technology continues to rapidly advance, with many circuit technologies being implemented using semiconductor fabrication processes. A variety of electrically conducting material is available for implementing the layers in the gates of semiconductor integrated circuits.

As well known in the art, silicon oxide film has been mainly used as a material of a gate insulating film in MOSFETs, and a polysilicon film has been used as a material of the gate. However, as the integration level of the semiconductor devices becomes higher, it is required that the line width of the gate and the thickness of the gate insulating film be reduced. In the case where a silicon oxide film is used as the material of the gate insulating film, if the thickness of the gate insulating film is too thin, the insulating characteristic is not stable, as the leakage current due to a direct tunneling through the gate insulating film becomes greater. Recently there has been an effort to use a high dielectric constant material, having a relatively higher dielectric constant than a silicon oxide film, as the material of the gate insulating film. Also, in order to minimize the polysilicon gate depletion effect, there has been an effort to use a metal gate instead of the polysilicon gate.

N-Metal films such as $TaSi_x$ appear to be useful as N-metals. However, in some applications, a lower work function may be needed than that of a pure deposited $TaSi_x$ film. Therefore, there is a need to provide methods of tuning the work function of a $TaSi_x$ film to better suit NMOS applications.

SUMMARY OF THE INVENTION

One aspect of the invention relates to a method of doping a $TaSi_x$ film with aluminum. The method comprises soaking a $TaSi_x$ film with an aluminum-containing compound. In one embodiment, the aluminum is deposited onto the $TaSi_x$ film. In some embodiments, the deposited aluminum diffuses throughout the $TaSi_x$ film. In certain specific embodiments, the aluminum-containing compound comprises tritertiarybutylaluminum or dimethylethylaminealane.

In another embodiment of this aspect, soaking the $TaSi_x$ film with an aluminum-containing compound, comprises exposing a $TaSi_x$ film to a flow of an aluminum-containing precursor. The conditions may be varied in certain embodiments. For example, in one embodiment, the substrate surface has a temperature of about 50° C. to about 450° C. In another embodiment, the $TaSi_x$ film has a thickness of from about 20 to about 60 A.

A second aspect of the invention relates to a method of depositing an aluminum-doped $TaSi_x$ film. The method comprises depositing a $TaSi_x$ film, and soaking the $TaSi_x$ film with an aluminum-containing compound. In one embodiment, the method further comprises repeating deposition of a $TaSi_x$ film and repeating soaking the $TaSi_x$ film with an aluminum-containing compound. According to various embodiments, the aluminum may deposited onto the $TaSi_x$ film. Alternatively, the deposited aluminum may be diffused throughout the $TaSi_x$ film.

In another embodiment of this aspect, each $TaSi_x$ film has a thickness of about 5 A to about 20 A. In yet another embodiment, the substrate surface has a temperature of about 50° C. to about 450° C. In specific embodiments, the aluminum-containing compound comprises tritertiarybutylaluminum or dimethylethylaminealane. In one variant of this aspect, soaking a $TaSi_x$ film with an aluminum-containing compound, comprises exposing the $TaSi_x$ film to a flow of an alane precursor.

A third aspect of the invention also relates to a method of depositing an aluminum-doped $TaSi_x$ film. The method comprising exposing a substrate surface to a first reactant gas comprising $TaCl_5$ to provide $TaCl_5$ at the substrate surface, exposing the substrate surface with $TaCl_5$ to a second reactant gas of aluminum-containing compound to provide tantalum and aluminum at the substrate surface, exposing the substrate surface to a third reactant gas comprising $TaCl_5$, and exposing the substrate surface with $TaCl_5$ to silane to provide a tantalum and silicon at the substrate surface. In one embodiment, the aluminum-containing compound comprises an aluminum alkyl compound. In a particular embodiment, the aluminum alkyl compound is triethyl aluminum.

In one embodiment, the substrate is exposed to the second reactant gas the silane alternatively. In an alternative embodiment, the substrate is exposed to the second reactant gas and the silane substantially simultaneously. According to various embodiments, the deposited film may have a thickness of about 20 A to 60 A. In other variants, the substrate surface has a temperature of about 50° C. to about 450° C.

The films formed in accordance to various embodiments of the invention may be used as a work function metal in complementary metal oxide semiconductor integration. Additionally, the films of one or more embodiments of the invention are suitable for use in NMOS metal gate applications.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways The work function is the minimum energy (usually measured in electron volts) needed to remove an electron from a solid to a point immediately outside the solid surface (or energy needed to move an electron from the Fermi level into vacuum). Typically, the work function for an N-metal is usually less than 4.5 eV. Pure $TaSi_x$ films often exhibit work function values of about 4.4 to about 4.6 eV. Although suitable in some NMOS applications, a lower work function may be required in certain situations. The work function of a $TaSi_x$ film may be tuned by doping the $TaSi_x$ film with aluminum. Where aluminum is used to dope the film, it is possible to meet the band edge work function. Thus, several embodiments of the present invention pertain to methods of providing $TaSi_x$ films doped with aluminum. Certain embodiments described herein particularly pertain to doping aluminum into an already deposited $TaSi_x$ film. Furthermore, certain other embodiments of the present invention relate to the deposition of $TaSi_x$ films while doping with aluminum. The films deposited according to one or more embodiments of the present invention are useful as an NMOS work function metal in complementary metal oxide semiconductor (CMOS) integration.

Accordingly, one aspect of the invention relates to a method of doping a TaSi$_x$ film with aluminum. The method comprises soaking a TaSi$_x$ film with an aluminum-containing compound. In embodiments related to this aspect, the TaSi$_x$ film is already deposited, and the soaking process is used to dope aluminum into the already existing TaSi$_x$ film.

Several of the embodiments of the invention relate to aluminum-containing compounds. In a specific embodiment, the aluminum-containing compound comprises an alane-type compound. Thus in even more specific embodiments, the aluminum-containing compound comprises tritertiarybutylaluminum (TTBA) or dimethylethylaminealane (DMEAA).

A "soak" or "soak process" as used herein is intended to refer to a quantity of a particular compound that is introduced into a reaction zone of a processing chamber to incorporate aluminum into the surface of a substrate. A particular soak process may include a single compound or a mixture/combination of two or more compounds. A soak can comprise a single cycle if two or more compounds are used. Soak processes generally have durations of about 1 second or more.

According to specific embodiments of the invention, soaking the TaSi$_x$ film with an aluminum-containing compound comprises exposing a TaSi$_x$ film to a flow of an aluminum-containing precursor. Such a process may involve film deposition followed by flowing the aluminum-containing compound without removing the wafer from the chamber. In certain embodiments, the wafer will be at an elevated temperature such that the aluminum-containing compound will decompose to add the aluminum to the deposited film.

This aspect of the invention is advantageous in embodiments where the TaSi$_x$ film has a thickness of about 20 A to about 60 A. In certain further embodiments, the aluminum will be added to the substrate surface. In other embodiments, the aluminum may diffuse into the film, particularly in thinner films. Where TaSi$_x$ film thickness increases, it may be difficult to obtain aluminum homogeneity, as the deposited aluminum atoms must diffuse further.

In certain embodiments, TaSi$_x$ film may be given a post treatment comprising soaking with disilane. This post treatment may be used to increase the amount of silicon in the film. Changing the silicon content allows variation of the silicon to tantalum ratio. In some embodiments, the ratio of silicon to tantalum is about 2. This corresponds to TaSi$_2$, which is the most stable phase of TaSi$_x$ and can undergo many different processes without significant change.

Another aspect of the invention relates to a method of depositing an aluminum-doped TaSi$_x$ film. The method comprises depositing a TaSi$_x$ film and soaking the TaSi$_x$ film with an aluminum-containing compound. In certain embodiments, the method further comprises repeating the deposition of a TaSi$_x$ film. In other embodiments, the method further comprises repeating soaking the TaSi$_x$ film with an aluminum-containing compound. In yet other embodiments, the method further comprises repeating both depositing a TaSi$_x$ film and soaking the TaSi$_x$ film with an aluminum-containing compound. The soaking process may be the same as that described above. Thus, in certain embodiments, the substrate surface has a temperature of about 50° C. to about 450° C. In other embodiments, the aluminum-containing compound comprises tritertiarybutylaluminum or dimethylethylaminealane. Again, in a particular embodiment, soaking a TaSi$_x$ film comprises exposing the TaSi$_x$ film to a flow of an alane precursor.

This aspect is particularly useful where thin layers of TaSi$_x$ films are deposited, as the process allows for aluminum doping as the TaSi$_x$ film is deposited. Accordingly in certain embodiments, each TaSi$_x$ film has a thickness of about 5 A to about 20 A. In certain embodiments, the aluminum is deposited onto the TaSi$_x$ film. In other embodiments, the aluminum diffuses throughout the TaSi$_x$ film.

As the TaSi$_x$ film layers are relatively thin, the aluminum atoms more readily diffuse throughout the film and increase the homogeneity of the film. Thus, in embodiments where an overall thick aluminum-doped TaSi$_x$ film is desired, the method may be repeated until the desired thickness is obtained. The resulting film will be thick and yet exhibit good homogeneity of aluminum doping.

TaSi$_x$ can be deposited during a deposition process using tantalum and silicon precursors. The tantalum precursors may be selected from TaCl$_5$ and TaF$_5$. The silicon precursors may be selected from SiH$_4$ and Si$_2$H$_6$. The value of "x" in the deposited metal layer depends upon two factors. The first factor is the ultimately desired work function. The second factor is the resistivity of the film. In general, the value of X will be in the range of about 0.1 to about 2.5.

In some embodiments, it may be useful to deposit an initiation layer. In one embodiment, the initiation layer may have a thickness of about 3 A to about 15 A. In a specific embodiment, the initiation layer is TaAlC. TaAlC can act as a nucleation layer even at one cycle of deposition. There are several ways of depositing a TaAlC layer. For example, TaAlC may be deposited via atomic layer deposition using TaCl$_5$ and triethyl aluminum (TEA) precursors. Accordingly, another aspect of the invention relates to a method for forming a metal layer on a substrate surface, the method comprising: exposing a substrate surface to a first reactant gas of the formula TaCl$_5$, and a second reactant gas of triethyl aluminum to form a TaAlC layer on the substrate surface during an atomic layer deposition process. The process may then involve exposing the substrate surface having the TaAlC layer to a treatment process to remove at least some of the unreacted first and second reactant gases. TaSi$_x$ may then be deposited as desired. The substrate surface may either be exposed sequentially or contemporaneously to the two precursor gases. This method may further comprise soaking the surface with SiH$_4$, and the substrate may comprise an oxide, TiN or TaN surface. Additionally, TaSi$_x$ may then be deposited using precursors selected from the group consisting of TaCl$_5$, TaF$_5$, SiH$_4$, Si$_2$H$_6$ and combinations thereof. This process may also comprise repeating sequentially the atomic layer deposition process and the treatment process. The method may additionally comprise soaking the surface of the substrate with SiH$_4$ to aid in TaSi$_x$ film deposition.

In another embodiment, an initiation layer may be deposited by exposing a substrate surface with an aluminum precursor. In specific embodiments, the precursor may be triethyl aluminum (TEA). In other embodiments, deposition of the initiation layer may comprise soaking the substrate surface with an aluminum precursor and, in specific embodiments, TEA.

Yet another aspect of the invention relates to a method of depositing an aluminum-doped TaSi$_x$ film. The method comprises exposing a substrate surface to a first reactant gas comprising TaCl$_5$ to provide TaCl$_5$ at the substrate surface; exposing the substrate surface with TaCl$_5$ to a second reactant gas of aluminum-containing compound to provide tantalum and aluminum at the substrate surface; exposing the substrate surface to a third reactant gas comprising TaCl$_5$; and exposing the substrate surface with TaCl$_5$ to silane to provide a tantalum and silicon at the substrate surface. In a particular embodiment, the aluminum-containing compound comprises an aluminum alkyl compound. In a further particular embodiment, the aluminum alkyl compound is triethyl aluminum (TEA).

In certain embodiments, the aluminum-containing precursor and silane can flow simultaneously or substantially simultaneously, which may be referred to as a "co-flow." In other embodiments, the aluminum-containing precursor and silane can be flowed substantially sequentially, which may be referred to as "alternative flow." In a particular embodiment of this aspect, the deposited film has a thickness of about 20 A to about 60 A. In another embodiment, the substrate surface has a temperature of about 50° C. to about 450° C.

In one aspect, films are deposited using alternative flow or co-flow processes. In exemplary embodiment of this aspect, a first chemical precursor ("A") is pulsed or flowed, for example, $TaCl_5$, to the substrate surface. Excess unused reactants and the reaction by-products are removed, typically by an evacuation-pump down and/or by a flowing inert purge gas. Then, a second precursor "B", for example triethylaluminum (TEA), is delivered to the surface, wherein the previously reacted precursor, creating an exchange by-product. In some embodiments, a second purge period is typically utilized to remove unused reactants and the reaction by-products. Then, another precursor "C," for example silane ($SiH_4$), is pulsed or flowed to the surface. This "C" precursor may also be followed with a purge step. The "A," "B" and "C" precursors, can then again be flowed. The alternating exposure of the surface to reactants "A," "B" and "C" is continued until the desired thickness film is reached, which for most anticipated applications would be approximately in the range of 5 nm to 40 nm, and more specifically in the range of 10 and 30 nm (100 Angstroms to 300 Angstroms). It will be understood that the "A," "B" and "C", and purge gases can flow simultaneously, and the substrate and/or gas flow nozzle can oscillate such that the substrate surface is sequentially exposed to the purge, "A," "B" and "C" gases as desired.

The precursors and/or reactants may be in a state of gas, plasma, vapor or other state of matter useful for a vapor deposition process. During the purge, typically an inert gas is introduced into the processing chamber to purge the reaction zone or otherwise remove any residual reactive compound or by-products from the reaction zone. Alternatively, the purge gas may flow continuously throughout the deposition process so that only the purge gas flows during a time delay between pulses of precursors.

Thus, in one or more embodiments, alternating pulses or flows of "A," "B" and "C" can be used to deposit a film, for example, in a pulsed delivery of multiple cycles of pulsed precursors, for example in a particular embodiment, A pulse, B pulse, A pulse, C pulse, A pulse, B pulse, A pulse, C pulse, and so on. As noted above, instead of pulsing the reactants, the gases can flow simultaneously from a gas delivery head or nozzle and the substrate and/or gas delivery head can be moved such that the substrate surface is sequentially exposed to the gases. Of course, the aforementioned cycles are merely exemplary of a wide variety of cycles in which a deposited layer is formed by alternating layers of precursors.

Alternatively, in a co-flow process, at least two of the precursors are flowed at least simultaneously together. In a particular embodiment of this process, for example, the film may be deposited using A pulse, B pulse, A and C pulse, A pulse, B pulse, A and C pulse, and so on.

A deposition gas or a process gas as used herein refers to a single gas, multiple gases, a gas containing a plasma, combinations of gas(es) and/or plasma(s). A deposition gas may contain at least one reactive compound for a vapor deposition process. The reactive compounds may be in a state of gas, plasma, vapor, during the vapor deposition process. Also, a process may contain a purge gas or a carrier gas and not contain a reactive compound.

The films in accordance with various embodiments of this invention can be deposited over virtually any substrate material. As the ALD processes described herein are low-temperature, it is particularly advantageous to use these processes with substrates that are thermally unstable. A "substrate surface," as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, silicon nitride, doped silicon, germanium, gallium arsenide, glass, sapphire, and any other materials such as metals, metal nitrides, metal alloys, and other conductive materials, depending on the application. Barrier layers, metals or metal nitrides on a substrate surface include titanium, titanium nitride, tungsten nitride, tantalum and tantalum nitride, aluminum, copper, or any other conductor or conductive or non-conductive barrier layer useful for device fabrication. Substrates may have various dimensions, such as 200 mm or 300 mm diameter wafers, as well as, rectangular or square panes. Substrates on which embodiments of the invention may be useful include, but are not limited to semiconductor wafers, such as crystalline silicon (e.g., Si<100> or Si<111>), silicon oxide, strained silicon, silicon germanium, doped or undoped polysilicon, doped or undoped silicon wafers, III-V materials such as GaAs, GaN, InP, etc. and patterned or non-patterned wafers. Substrates may be exposed to a pretreatment process to polish, etch, reduce, oxidize, hydroxylate, anneal and/or bake the substrate surface.

As embodiments of the invention provide a method for depositing or forming aluminum-doped $TaSi_x$ films, a processing chamber is configured to expose the substrate to a sequence of gases and/or plasmas during the vapor deposition process. The processing chamber would include separate supplies of the A, B and C reactants, along with any supply of carrier, purge and inert gases such as argon and nitrogen in fluid communication with gas inlets for each of the reactants and gases. Each inlet may be controlled by an appropriate flow controller such as a mass flow controller or volume flow controller in communication with a central processing unit (CPU) that allows flow of each of the reactants to the substrate to perform a ALD process as described herein. Central processing unit may be one of any forms of a computer processor that can be used in an industrial setting for controlling various chambers and sub-processors. The CPU can be coupled to a memory and may be one or more of readily available memory such as random access memory (RAM), read only memory (ROM), flash memory, compact disc, floppy disk, hard disk, or any other form of local or remote digital storage. Support circuits can be coupled to the CPU to support the CPU in a conventional manner. These circuits include cache, power supplies, clock circuits, input/output circuitry, subsystems, and the like.

The co-reactants are typically in vapor or gas form. The reactants may be delivered with a carrier gas. A carrier gas, a purge gas, a deposition gas, or other process gas may contain nitrogen, hydrogen, argon, neon, helium, or combinations thereof. The various plasmas described herein, such as the nitrogen plasma or the inert gas plasma, may be ignited from and/or contain a plasma co-reactant gas.

In one or more embodiments, the various gases for the process may be pulsed into an inlet, through a gas channel, from various holes or outlets, and into a central channel. In one or more embodiments, the deposition gases may be sequentially pulsed to and through a showerhead. Alternatively, as described above, the gases can flow simultaneously through gas supply nozzle or head and the substrate and/or the gas supply head can be moved so that the substrate is sequentially exposed to the gases.

Another aspect of the invention pertains to an apparatus for deposition of a film on a substrate to perform a process according to any of the embodiments described above. In one embodiment, the apparatus comprises a deposition chamber for atomic layer deposition of a film on a substrate. The chamber comprises a process area for supporting a substrate. The apparatus includes a precursor inlet in fluid communication with a supply of a $TiCl_4$ or $TaCl_5$ precursor. The apparatus also includes a reactant gas inlet in fluid communication with a supply of a alane precursor, as discussed above. The apparatus further includes a purge gas inlet in fluid communication with a purge gas. The apparatus can further include a vacuum port for removing gas from the deposition chamber. The apparatus can further include an auxiliary gas inlet for supplying one or more auxiliary gases such as inert gases to the deposition chamber. The deposition can further include a means for heating the substrate by radiant and/or resistive heat.

In some embodiments, a plasma system and processing chambers or systems which may be used during methods described here for depositing or forming photoresist materials can be performed on either PRODUCER®, CENTURA®, or ENDURA® systems, all available from Applied Materials, Inc., located in Santa Clara, Calif. A detailed description of an ALD processing chamber may be found in commonly assigned U.S. Pat. Nos. 6,878,206, 6,916,398, and 7,780,785.

The processes according to one or more embodiments of the invention provide that the processing chamber or the deposition chamber may be pressurized at a pressure within a range from about 0.01 Torr to about 100 Torr, for example from about 0.1 Torr to about 10 Torr, and more specifically, from about 0.5 Torr to about 5 Torr. Also, according to one or more embodiments, the chamber or the substrate may be heated such that deposition can take place at a temperature lower than about 550° C.

Precursor delivery to the substrate surface may be accomplished by exposing the substrate to the "A," "B" and/or "C" precursor gas or vapor formed by passing a carrier gas (for example, nitrogen or argon) through an ampoule of the precursor, which may be in liquid form. The ampoule may be heated. The precursor gas can be delivered at any suitable flow rate within a range from about 10 sccm to about 2,000 sccm, for example, from about 50 sccm to about 1,000 sccm, and in specific embodiments, from about 100 sccm to about 500 sccm, for example, about 200 sccm. The substrate may be exposed to the metal-containing precursor gas for a time period within a range from about 0.1 seconds to about 10 seconds, for example, from about 1 second to about 5 seconds, and in a specific example, for approximately 2 seconds. The flow of the precursor gas is stopped once the precursor has adsorbed onto all reactive surface moieties on the substrate surface. In an ideally behaved ALD process, the surface is readily saturated with the reactive precursor such that additional exposure would not result in additional deposition (i.e. the process is self-limiting due to the consumption of all reactive surface moieties).

In a particular embodiment, the substrate surface is exposed to the $TaCl_5$ precursor by flowing argon gas at a rate of about 200 sccm to about 1000 sccm through a $TaCl_5$ ampoule held between about 70° C. and about 100° C. In another particular embodiment, the substrate surface is exposed to the aluminum-containing compound by flowing argon gas at a rate of about 200 sccm to about 1000 sccm through an ampoule held between about 30° C. to about 60° C.

The substrate and chamber may be exposed to a purge step after stopping the flow of the precursor gas. A purge gas may be administered into the processing chamber with a flow rate within a range from about 10 sccm to about 2,000 sccm, for example, from about 50 sccm to about 1,000 sccm, and in a specific example, from about 100 sccm to about 500 sccm, for example, about 200 sccm. The purge step removes any excess precursor, byproducts and other contaminants within the processing chamber. The purge step may be conducted for a time period within a range from about 0.1 seconds to about 8 seconds, for example, from about 1 second to about 5 seconds, and in a specific example, from about 4 seconds. The carrier gas, the purge gas, the deposition gas, or other process gas may contain nitrogen, hydrogen, argon, neon, helium, or combinations thereof. In one example, the carrier gas comprises nitrogen.

EXAMPLES

Example 1A

Comparative $TaSi_x$ was deposited directly onto a substrate at a temperature of about 400° C. The film was then annealed. The resulting film composition had a silicon to tantalum ratio of about 1.7. No aluminum was added to the film. MOSCAP split measurements showed that the film had a work function of about 4.6 eV.

Example 1B

Comparative $TaSi_x$ was deposited directly onto a substrate at a temperature of about 450° C. The film was then annealed. The resulting film composition had a silicon to tantalum ratio of about 1.5. No aluminum was added to the film. MOSCAP split measurements showed that the film had a work function of about 4.6 eV.

Example 2A $TaSi_x$ with Aluminum

A film of aluminum-doped $TaSi_x$ was deposited onto a high-k cap layer having a thickness of 15 A by using a co-flow of triethylamine and silane at 450° C. The resulting aluminum content was about atomic 5%. MOS CAP split measurements showed that the film had a work function of about 4.35 eV.

Example 2B $TaSi_x$ with Aluminum

A film of aluminum-doped $TaSi_x$ was deposited onto a substrate by using a co-flow of triethylamine and silane at 450° C. as in Example 2A, but the high-k cap layer was thinner (at about 8 A). The resulting aluminum content was about atomic 5%. MOSCAP split measurements showed that the film had a work function of about 4.25 eV.

Examples 1-2 demonstrate that doping of $TaSi_x$ films with aluminum, even at as low as only about 5%, is effective to reduce the work function value. It should be noted that in the above examples, MOSCAP split results demonstrated that the leakage current and equivalent oxide thickness (EOT) measurements were the same across Examples 1-2.

Example 4

Soak with DMAH 5 cycles of $TaSi_x$ film were deposited. The film was then soaked with DMAH at 175° C. The film exhibited the elemental content as shown in table 1 below. The results demonstrated that the DMAH soak was successful in depositing aluminum at the surface of the $TaSi_x$ film.

TABLE 1

| | Elemental Content after DMAH soak | | | |
| --- | --- | --- | --- | --- |
| | Averaged quantification (at. %) in bulk film: | | | |
| | Al2p | O1s | Si2p | Ta4f |
| 175° C. | 15.0 at surface | 5.9 | 38.3 | 53.9 |

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A method of doping a $TaSi_x$ film with aluminum, the method comprising soaking a $TaSi_x$ film with an aluminum-containing compound.

2. The method of claim 1, wherein the aluminum-containing compound comprises tritertiarybutylaluminum or dimethylethylaminealane.

3. The method of claim 1, wherein soaking the $TaSi_x$ film with an aluminum-containing compound, comprises exposing a $TaSi_x$ film to a flow of an aluminum-containing precursor.

4. The method of claim 1, wherein aluminum is deposited onto the $TaSi_x$ film.

5. The method of claim 4, wherein deposited aluminum diffuses throughout the $TaSi_x$ film.

6. The method of claim 1, wherein the $TaSi_x$ film has a thickness of from about 20 angstroms to about 60 angstroms.

7. The method of claim 1, wherein the $TaSi_x$ film has a temperature of about 50 ° C. to about 450° C.

8. A method of depositing of an aluminum-doped $TaSi_x$ film, the method comprising:
depositing a $TaSi_x$ film; and
soaking the $TaSi_x$ film with an aluminum-containing compound.

9. The method of claim 8, further comprising repeating deposition of a $TaSi_x$ film and repeating soaking the $TaSi_x$ film with an aluminum-containing compound.

10. The method of claim 9, wherein each $TaSi_x$ film has a thickness of about 5 angstroms to about 20 angstroms.

11. The method of claim 8, wherein the substrate surface has a temperature of about 50° C. to about 450° C.

12. The method of claim 8, wherein the aluminum-containing compound comprises tritertiarybutylaluminum or dimethylethylaminealane.

13. The method of claim 8, wherein soaking a $TaSi_x$ film with an aluminum-containing compound, comprises exposing the $TaSi_x$ film to a flow of an alane precursor.

14. The method of claim 8, wherein aluminum is deposited onto the $TaSi_x$ film.

* * * * *